United States Patent
Huang et al.

(10) Patent No.: US 10,617,022 B2
(45) Date of Patent: Apr. 7, 2020

(54) CONNECTING STRUCTURE FOR CIRCUIT BOARD AND OUTPUT TERMINAL OF POWER SUPPLY

(71) Applicant: Changzhou Jutai Electronic Co., Ltd., Changzhou (CN)

(72) Inventors: Wei Huang, Changzhou (CN); Chengqian Pan, Changzhou (CN); Bin Chen, Changzhou (CN)

(*) Notice: Subject to any disclaimer, the term of this patent is extended or adjusted under 35 U.S.C. 154(b) by 0 days.

(21) Appl. No.: 16/009,000

(22) Filed: Jun. 14, 2018

(65) Prior Publication Data
US 2018/0368272 A1    Dec. 20, 2018

(30) Foreign Application Priority Data
Jun. 15, 2017  (CN) .................... 2017 2 0694459 U

(51) Int. Cl.
| | |
|---|---|
| *H05K 5/00* | (2006.01) |
| *H05K 1/18* | (2006.01) |
| *H01R 12/71* | (2011.01) |
| *H05B 33/08* | (2020.01) |
| *H01R 13/52* | (2006.01) |
| *H05B 37/02* | (2006.01) |
| *H05K 5/02* | (2006.01) |

(Continued)

(52) U.S. Cl.
CPC ......... *H05K 5/0069* (2013.01); *H01R 12/718* (2013.01); *H01R 13/5205* (2013.01); *H05B 33/0803* (2013.01); *H05B 33/0845* (2013.01); *H05B 37/02* (2013.01); *H05K 1/18* (2013.01); *H05K 5/0247* (2013.01); *F21S 4/10* (2016.01); *H05K 3/3447* (2013.01); *H05K 2201/10295* (2013.01); *H05K 2201/10333* (2013.01); *H05K 2201/10446* (2013.01); *H05K 2201/10962* (2013.01)

(58) Field of Classification Search
USPC .................. 361/752, 728, 796, 800
See application file for complete search history.

(56) References Cited

U.S. PATENT DOCUMENTS

| | | | | |
|---|---|---|---|---|
| 3,812,452 A | * | 5/1974 | Sturm | H01R 13/112 439/857 |
| 8,096,814 B2 | * | 1/2012 | Schell | H01R 13/11 439/79 |

(Continued)

FOREIGN PATENT DOCUMENTS

CN          105338703 A     2/2016

*Primary Examiner* — Hung S. Bui
(74) *Attorney, Agent, or Firm* — W&K IP

(57) ABSTRACT

The utility model discloses a the connecting structure for the circuit board and the output terminal of the power supply, comprises a casing, a tail cover, and the circuit board with a control circuit, wherein one end of the casing has an opening, at least part of the circuit board is installed in a cavity of the casing, the output terminal is arranged on the tail cover, and the output terminal at least comprises a conductive pin. The connecting structure further comprises a conductive insertion component, wherein the insertion component is fixed to an output end of the circuit board, and when the tail cover and the open end of the casing are closed, the end of the conductive pin is inserted into the insertion component to allow the circuit board and the output terminal to be electrically connected, which has the advantage of rapid assembly.

7 Claims, 9 Drawing Sheets

(51) Int. Cl.
*H05K 3/34* (2006.01)
*F21S 4/10* (2016.01)

(56) References Cited

U.S. PATENT DOCUMENTS 8,608,489 B2 * 12/2013 Nogami ............. H01R 13/6658
 439/377
2018/0139824 A1 5/2018 Jutai

* cited by examiner

CONNECTING STRUCTURE FOR CIRCUIT BOARD AND OUTPUT TERMINAL OF POWER SUPPLY

CROSS-REFERENCE TO RELATED APPLICATIONS

This application claims priority of Chinese Patent Application No. 201720694459.5 with a filing date of Jun. 15, 2017. The content of the aforementioned application, including any intervening amendments thereto, are incorporated herein by reference.

TECHNICAL FIELD

The present utility model relates to a connecting structure for a circuit board and an output terminal of a power supply.

BACKGROUND ART

On some festival days, LED light strings are usually needed to increase holiday spirit. An LED light string needs to be driven by a driving power supply, so that LED lights emit light in various flashing modes. Existing driving power supplies include vertical and horizontal power supplies. A vertical driving power supply for a lamp, as disclosed in the invention patent with the Publication No. CN105338703A, as shown in FIG. 1 and FIG. 2, comprises a casing 1 and a tail cover 2 which are integrally formed. One end of the casing 1 is closed, and the other end has an opening. The tail cover 2 and the open end of the casing 1 are fixedly connected. The tail cover 2 is provided with a hole. The vertical driving power supply further comprises a circuit board 3 with a control circuit, a switch 4 for generating a pulse signal, and a seal 5, wherein at least part of the circuit board 3 is installed in a cavity of the casing 1, one end of the switch 4 is welded and fixed to the circuit board 3, the other end of the switch 4 is a free end, the seal 5 is installed in the hole of the tail cover to seal the hole, after the tail cover 2 and the casing 1 are fixed, the seal 5 abuts against the free end of the switch 4, and one end of the seal 5 is exposed in the air.

In the above driving power supply, an output waterproof socket 2a is arranged on the tail cover 2, and a conductive pin is arranged in the waterproof socket 2a. As can be directly seen from FIG. 2, the conductive pin is electrically connected with an output end of the circuit board 3 through a wire. Although such a connection method achieves the purpose of conduction, during assembly, since the conductive pin and the waterproof socket 2a are fixed and integrated firstly, and then the conductive pin is welded to the output end of the circuit board 3 through the wire, obviously, the length of the wire must not be too long, as a result, the space between the circuit board 3 and the tail cover 2 is compressed by a large margin, and welding in such a small space not only increases the operation difficulty of operators, but also requires much time and effort.

SUMMARY OF THE INVENTION

The present utility model aims to provide a connecting structure for a circuit board and an output terminal of a power supply, which has the advantage of rapid assembly.

The connecting structure for the circuit board and the output terminal of the power supply comprises a casing, a tail cover, and the circuit board with a control circuit, wherein one end of the casing has an opening, at least part of the circuit board is installed in a cavity of the casing, the output terminal is arranged on the tail cover, and the output terminal at least comprises a conductive pin. The connecting structure further comprises a conductive insertion component, wherein the insertion component is fixed to an output end of the circuit board, and when the tail cover and the open end of the casing are closed, the end of the conductive pin is inserted into the insertion component to allow the circuit board and the output terminal to be electrically connected.

The insertion component comprises a body, one end of the body is provided with plug pins connected with the circuit board, and the body is provided with a connecting component allowing the end of the conductive pin to be inserted therein.

After the conductive pin is inserted into the connecting component, the connecting component is expanded.

The connecting component comprises a first clamp block and a second clamp block. The first clamp block and the second clamp block are oppositely disposed on the body and are not parallel to each other. One end of the first clamp block and one end of the second clamp block are both connected with the body, and the other end of the first clamp block and the other end of the second clamp block are free ends.

The first clamp block and the second clamp block are arranged on the body in a splayed mode.

The body is provided with a notch, and the connecting component is located at the notch.

The connecting component is located at the other end of the body.

The body has a V-shaped or U-shaped cross section.

The output terminal further comprises an insertion base which is fixed to the tail cover to form an integral body, the other end of the conductive pin is provided with a slot, the conductive pin is provided with a toothed component, and the insertion base is formed on the toothed component of the conductive pin and the end with the slot through injection molding.

A power supply comprises the connecting structure.

The present utility model has the advantages that when the tail cover and the open end of the casing are closed, the end of the conductive pin is inserted into the insertion component to allow the circuit board and the output terminal to be electrically connected, in this way, due to the fact that the connection of the insertion component is completed directly on the circuit board and does not need to involve the conductive pin, the connection of the insertion component to the circuit board is not limited by space; furthermore, the conductive pin and the insertion component are connected through insertion, which is quick and easy, thus, the structure enables assembling efficiency to be improved.

11 casing, 12 tail cover, 13 circuit board, 14 conductive pin, 14a slot, 14b toothed component, 15 insertion base, 16 insertion component, 16a body, 16b plug pin, 16c first clamp block, 16d second clamp block, 16e ring, 16f insertion hole.

DETAILED DESCRIPTION OF THE INVENTION

Figure 1:
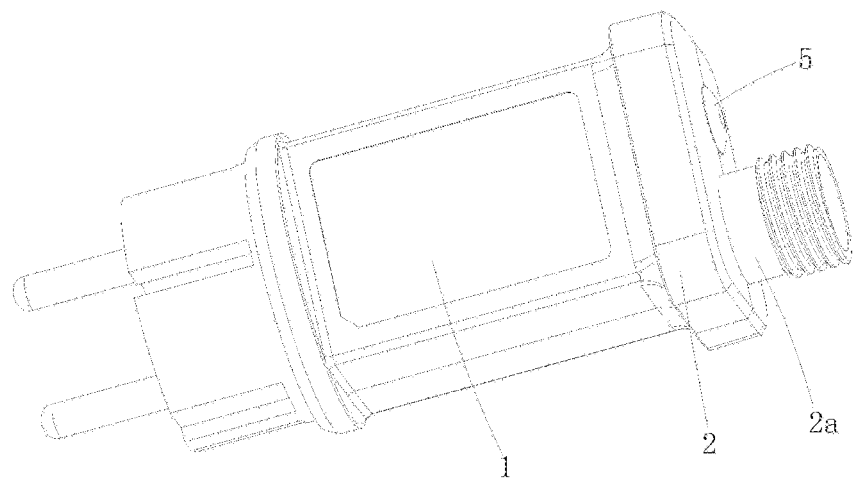
FIG. 1 is a schematic view of the outline of a vertical driving power supply in the prior art.
Figure 2:
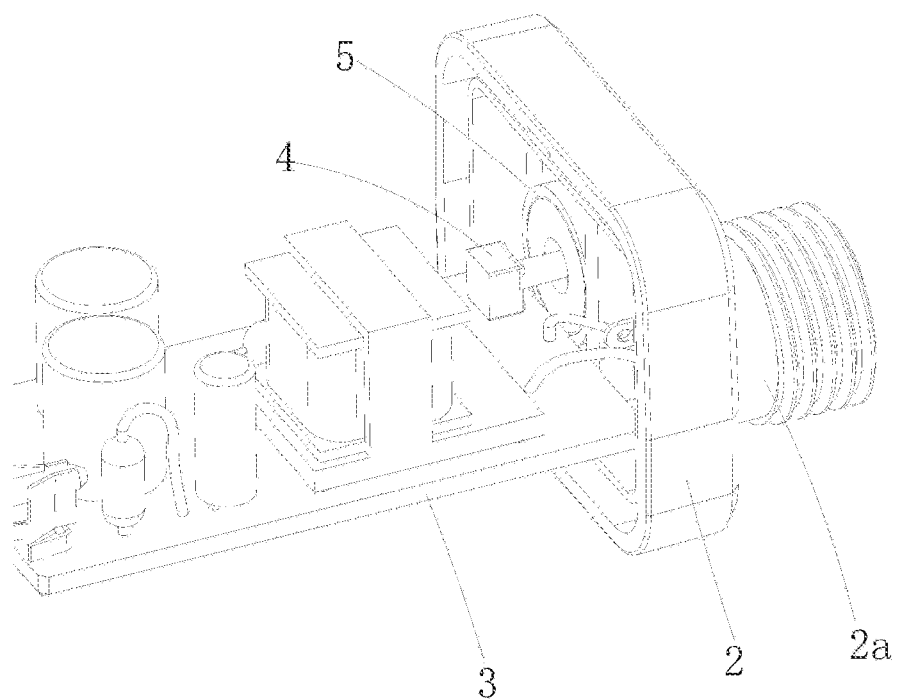
FIG. 2 is a schematic view with a casing in FIG. 1 being hidden.
Figure 3:
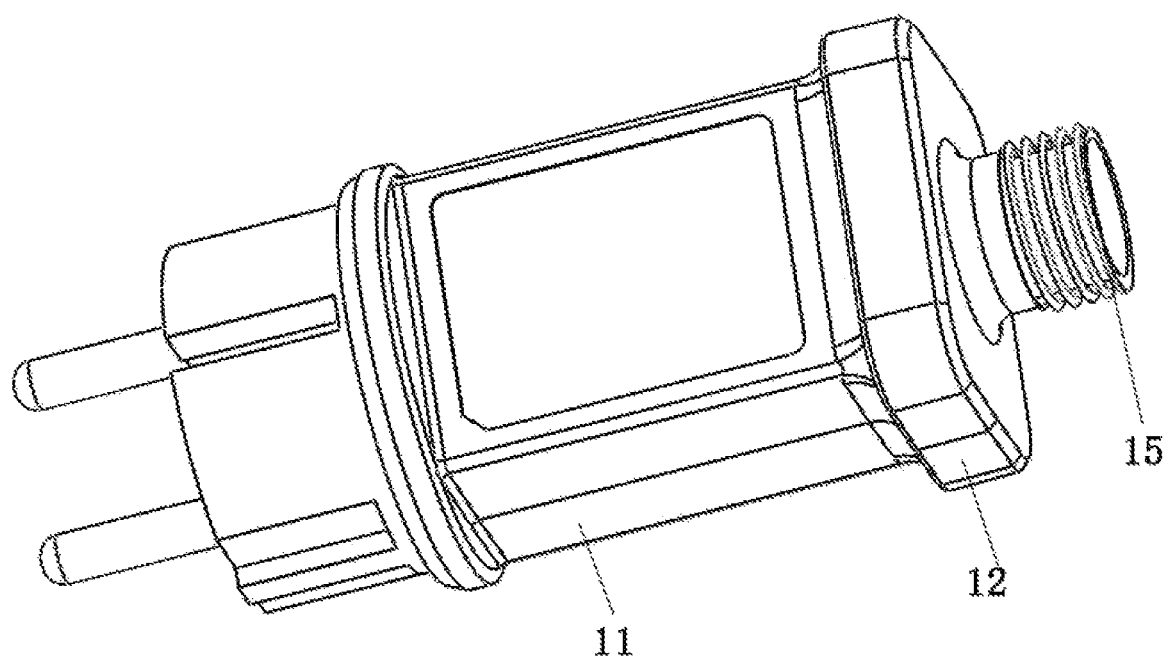
FIG. 3 is a schematic view of the appearance of a power supply according to the present utility model.

As shown in FIG. 3, a connecting structure for a circuit board and an output terminal of a power supply according to the present utility model comprises a casing 11, a tail cover 12, and the circuit board 13 with a control circuit, one end of the casing 11 has an opening, at least part of the circuit board 13 is installed in a cavity of the casing 11, and the control circuit on the circuit board 13 may be any one disclosed in the Publication No. CN105338703A, and may also be the circuit disclosed in Patent Application No. 2016212323770 and the like. The output terminal is arranged on the tail cover 12, the output terminal at least comprises a conductive pin 14, the output terminal further comprises an insertion base 15 which is fixed to the tail cover to form an integral body, the other end of the conductive pin 14 is provided with a slot 14a, and the conductive pin 14 is provided with a toothed component 14b. The insertion base 15 is formed on the toothed component 14b of the conductive pin and the end with the slot 14a through injection molding. The conductive pin 14 and the insertion base 15 are firmly combined by means of the toothed component 14b, and the conductive pin 14 can be prevented from moving relative to the insertion base 15.

The connecting structure further comprises a conductive insertion component 16, the insertion component 16 is fixed to an output end of the circuit board, and when the tail cover 12 and the open end of the casing 11 are closed, the end of the conductive pin 14 is inserted into the insertion component 16 to allow the circuit board 13 and the output terminal to be electrically connected. The insertion component comprises a body 16a having a V-shaped cross section. One end of the body 16a is provided with plug pins 16b connected with the circuit board 13. After being inserted in the circuit board 13, the plug pins 16b are fixed to the circuit board 13 by welding, so that the whole of the insertion component 16 is fixed to the circuit board 13 to form an integral body. The body 16a is provided with a connecting component allowing the end of the conductive pin 14 to be inserted therein, the body 16a is provided with a notch, and the connecting component is located at the notch. Preferably, after the conductive pin 14 is inserted into the connecting component, the connecting component is expanded. The connecting component comprises a first clamp block 16c and a second clamp block 16d. The first clamp block 16c and the second clamp block 16d are oppositely disposed on the body 16a and are not parallel to each other. One end of the first clamp block 16c and one end of the second clamp block 16d are both connected with the body 16a, and the other end of the first clamp block 16c and the other end of the second clamp block 16d are free ends. Because the first clamp block 16c and the second clamp block 16d each have a free end, when the conductive pin 14 is inserted into the space between the first clamp block 16c and the second clamp block 16d, the first clamp block 16c and the second clamp block 16c will be elastically deformed, and since the first clamp block 16c and the second clamp block 16d are not parallel to each other, an included angle is formed between the first clamp block 16c and the second clamp block 16d. Thus, the conductive pin 14 can expand the connecting component more easily. In other words, the first clamp block 16c and the second clamp block 16d can more easily clamp the conductive pin 14, thereby ensuring the transmission of electric signals. As for the unparallel relationship between the first clamp block 16c and the second clamp block 16d, preferably, the first clamp block 16c and the second clamp block 16d are arranged on the body 16a in a splayed mode, that is to say, the first clamp block 16c and the second clamp block 16d are disposed on the body 16a in a mirror-symmetrical mode.

Figure 6:
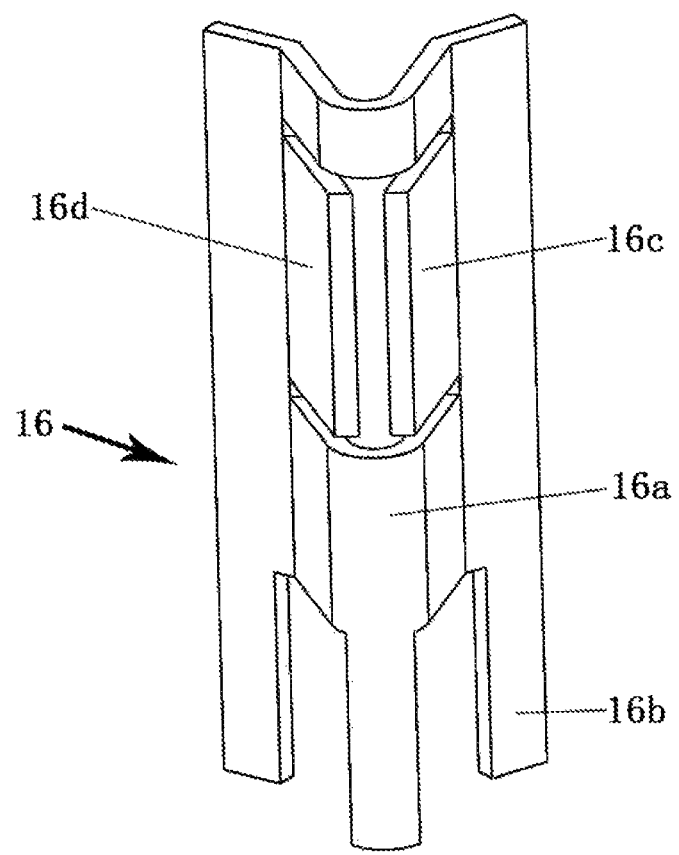
FIG. 6 is a schematic view of a first type of insertion component according to the present utility model.

The present utility model is not limited to the above embodiment. As shown in FIG. 6, the body 16a has a U-shaped cross section, and the connecting component is located at the other end of the body 16a.

Figure 7:
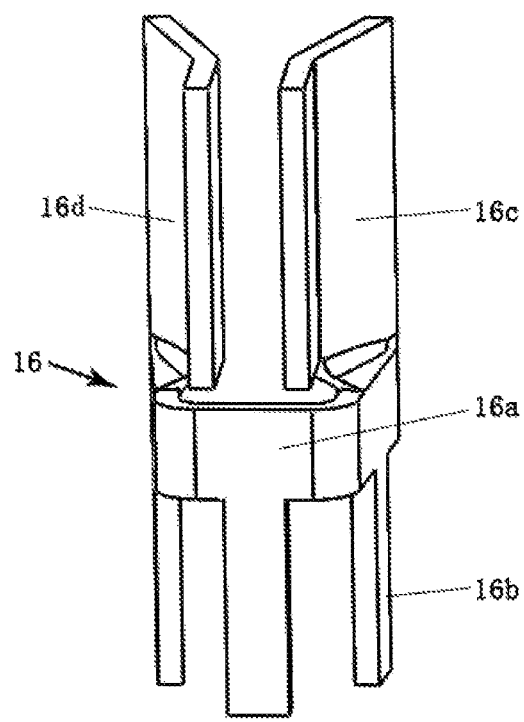
FIG. 7 is a schematic view of a second type of insertion component according to the present utility model.

The present utility model is not limited to the above embodiment. As shown in FIG. 7, the insertion component 16 is composed of a body 16a and a connecting component fixed on the body 16a. The body 16a has a rectangular cross section, and the connecting component is a ring with an opening. An insertion port of the ring is provided with a ramp for guiding the conductive pin 14, and the conductive pin 14 is inserted into the ring 16e so as to expand the ring.

Figure 8:
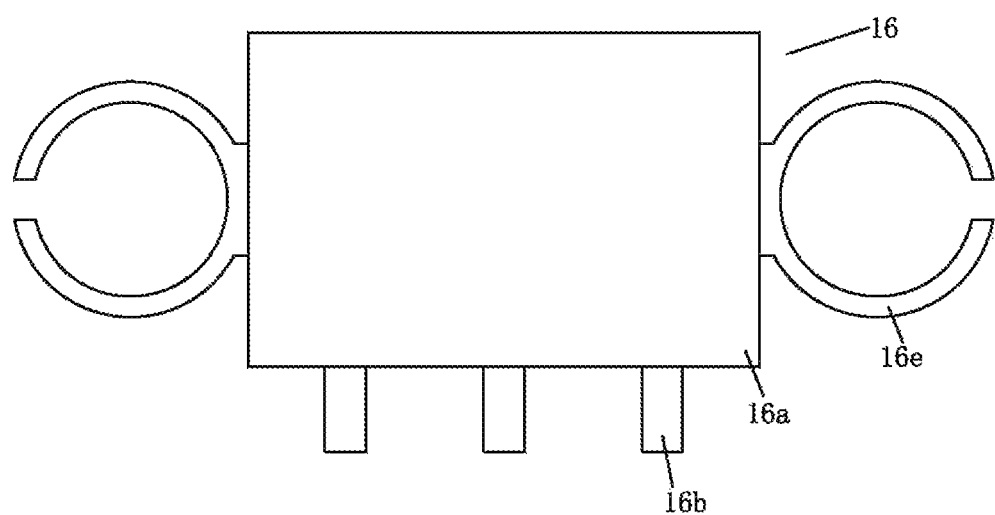
FIG. 8 is a schematic view of a third type of insertion component according to the present utility model.
Figure 9:
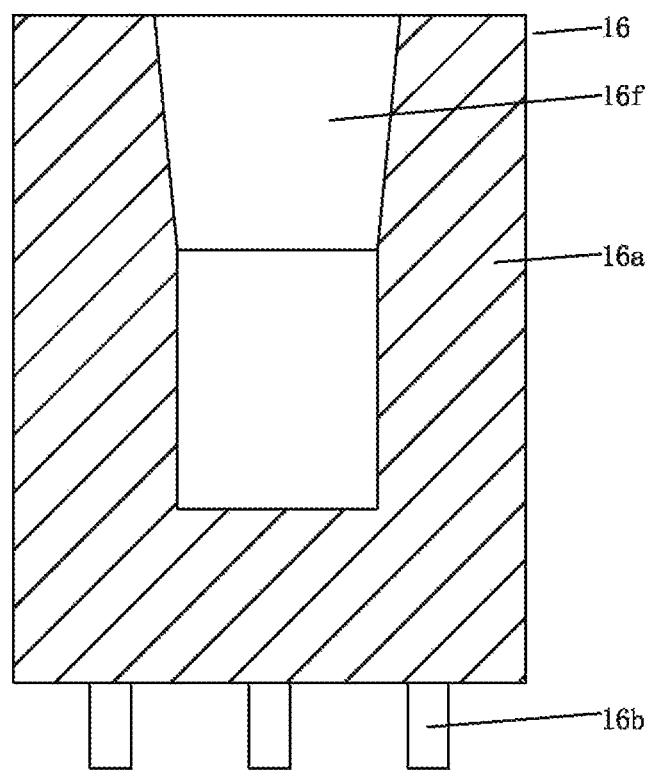
FIG. 9 is a schematic view of a fourth type of insertion component according to the present utility model.

The present utility model is not limited to the above embodiment. As shown in FIG. 8, the insertion component 16 comprises a body 16a. An insertion hole 16f is formed in the body 16a. The insertion hole 16f comprises a tapered hole section. The insertion hole 16f may also comprises a straight hole section connected with the tapered hole section. When the insertion hole 16f only has a tapered hole section, the tapered hole section is used for guiding and expanding the conductive pin 14, and when the insertion hole 16f is composed of a tapered hole section and a straight hole section, the tapered hole section is used for guiding the conductive pin 14, and the straight hole section is used for expanding the conductive pin 14.

Figure 4:
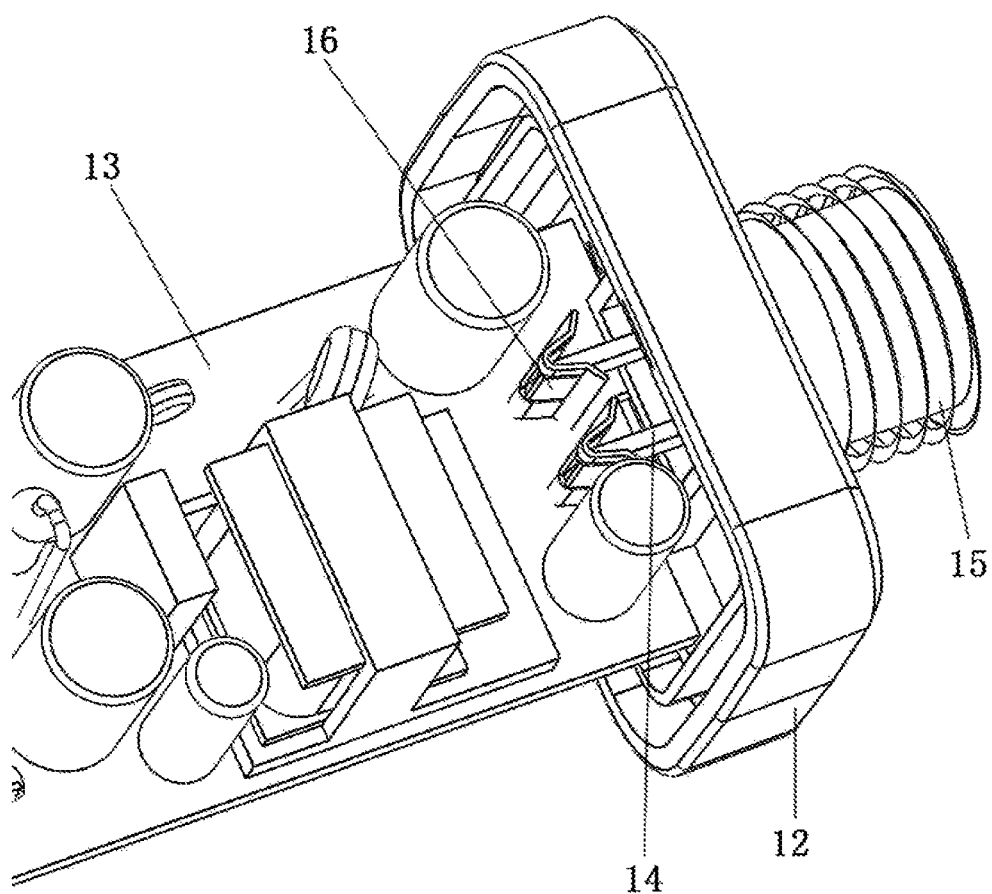
FIG. 4 is a schematic view with a casing in FIG. 3 being hidden.
Figure 5:
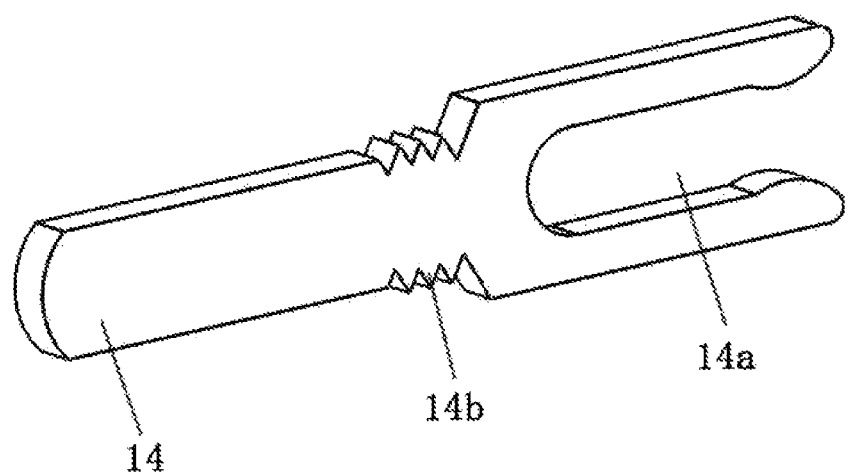
FIG. 5 is a schematic view of a conductive pin according to the present utility model.

As shown in FIG. 3 and FIG. 4, a power supply according to the present utility model comprises any one of the connecting structures in the above embodiments. The power supply according to the present utility model can be applied to the driving of LED lights or LED light strings, so that the LED lights or LED light strings emit light in various flashing modes.

We claim:

1. A connecting structure for a circuit board and an output terminal of a power supply, comprising a casing, a tail cover, and the circuit board with a control circuit, one end of the casing having an opening, at least part of the circuit board being installed in a cavity of the casing, the output terminal being arranged on the tail cover, the output terminal at least comprising a conductive pin, the connecting structure being characterized by further comprising a conductive insertion component, the insertion component being fixed to an output end of the circuit board, and when the tail cover and the open end of the casing are closed, the end of the conductive pin being inserted into the insertion component to allow the circuit board and the output terminal to be electrically connected;

wherein the insertion component comprises a body, one end of the body is provided with plug pins connected with the circuit board, and the body is provided with a connecting component allowing the end of the conductive pin to be inserted therein;

wherein after the conductive pin is inserted into the connecting component, the connecting component is expanded; and wherein the connecting component comprises a first clamp block and a second clamp block, the first clamp block and the second clamp block are oppositely disposed on the body and are not parallel to each other, one end of the first clamp block and one end of the second clamp block are both connected with the body, and the other end of the first clamp block and the other end of the second clamp block are free ends.

2. The connecting structure for the circuit board and the output terminal of the power supply according to claim 1, wherein the first clamp block and the second clamp block are arranged on the body in a splayed mode.

3. The connecting structure for the circuit board and the output terminal of the power supply according to claim 1, wherein the body is provided with a notch, and the connecting component is located at the notch.

4. The connecting structure for the circuit board and the output terminal of the power supply according to claim 1, wherein the connecting component is located at the other end of the body.

5. The connecting structure for the circuit board and the output terminal of the power supply according to claim 1, wherein the body has a V-shaped or U-shaped cross section.

6. The connecting structure for the circuit board and the output terminal of the power supply according to claim 1, characterized in that the output terminal further comprises an insertion base which is fixed to the tail cover to form an integral body, the other end of the conductive pin is provided with a slot, the conductive pin is provided with a toothed component, and the insertion base is formed on the toothed component of the conductive pin and the end with the slot through injection molding.

7. A power supply, characterized by comprising the connecting structure according to claim 1.

* * * * *